(12) United States Patent
Ullmann et al.

(10) Patent No.: US 7,843,342 B2
(45) Date of Patent: Nov. 30, 2010

(54) ORGANIC CLOCK GENERATOR

(75) Inventors: Andreas Ullmann, Zirndorf (DE);
Alexander Knobloch, Erlangen (DE);
Merlin Welker, Baiersdorf (DE);
Walter Fix, Nuremberg (DE)

(73) Assignee: Polyic GmbH & Co. KG, Furth (DE)

( * ) Notice: Subject to any disclaimer, the term of this patent is extended or adjusted under 35 U.S.C. 154(b) by 149 days.

(21) Appl. No.: 11/817,329

(22) PCT Filed: Feb. 21, 2006

(86) PCT No.: PCT/EP2006/001522
§ 371 (c)(1),
(2), (4) Date: Oct. 15, 2007

(87) PCT Pub. No.: WO2006/092215
PCT Pub. Date: Sep. 8, 2006

(65) Prior Publication Data
US 2008/0265965 A1    Oct. 30, 2008

(30) Foreign Application Priority Data
Mar. 1, 2005    (DE) .................. 10 2005 009 819

(51) Int. Cl.
*G08B 13/14*    (2006.01)
*H03K 3/03*    (2006.01)

(52) U.S. Cl. ...................... 340/572.1; 331/57
(58) Field of Classification Search .............. 331/57; 340/572.4, 572.7, 572.1; 332/112; 235/472.02
See application file for complete search history.

(56) References Cited
U.S. PATENT DOCUMENTS

| | | | |
|---|---|---|---|
| 3,512,052 A | 5/1970 | MacIver et al. | |
| 3,769,096 A | 10/1973 | Ashkin | |
| 3,955,098 A | 5/1976 | Kawamoto | |
| 3,999,122 A | 12/1976 | Winstel et al. | |
| 4,246,298 A | 1/1981 | Guarnery | |
| 4,302,648 A | 11/1981 | Sado et al. | |
| 4,340,057 A | 7/1982 | Bloch | |
| 4,442,019 A | 4/1984 | Marks | |
| 4,554,229 A | 11/1985 | Small | |

(Continued)

FOREIGN PATENT DOCUMENTS

| | | |
|---|---|---|
| DE | 2102735 | 8/1972 |
| DE | 33 38 597 | 5/1985 |
| DE | 41 03 675 | 8/1992 |

(Continued)

OTHER PUBLICATIONS

Kind, D., "Einfuhrung in die Hochspannungs-Versuchstechnik", Friedrich. Vieweg & Sohn, Braunschweig/Wiesbaden, pp. 16-21. 1985.

(Continued)

*Primary Examiner*—Robert Pascal
*Assistant Examiner*—Ryan Johnson
(74) *Attorney, Agent, or Firm*—Carella, Byrne et al.; Elliot M. Olstein; William Squire

(57) ABSTRACT

An organic electronic module has a clock generator having n organic switching elements connected in series. The output of the nth organic switching element is connected to the input of the first organic switching element. The outputs of two or more organic switching elements are connected to respective inputs of a first electronic circuit of the electronic module tapping off two or more clock signals such that a first clock signal for a first electronic circuit is tapped from the output of a first one of the switching elements and a second clock signal, phase-shifted with respect to the first clock signal, for the first electronic circuit is tapped from the output of a second switching element different than the first switching element.

12 Claims, 3 Drawing Sheets

U.S. PATENT DOCUMENTS

| | | |
|---|---|---|
| 4,865,197 A | 9/1989 | Craig |
| 4,926,052 A | 5/1990 | Hatayama |
| 4,937,119 A | 6/1990 | Nickles et al. |
| 5,075,816 A | 12/1991 | Stormbom |
| 5,173,835 A | 12/1992 | Cornett et al. |
| 5,206,525 A | 4/1993 | Yamamoto et al. |
| 5,259,926 A | 11/1993 | Kuwabara et al. |
| 5,321,240 A | 6/1994 | Takahira |
| 5,347,144 A | 9/1994 | Garnier et al. |
| 5,364,735 A | 11/1994 | Akamatsu |
| 5,395,504 A | 3/1995 | Hoffman et al. |
| 5,480,839 A | 1/1996 | Ezawa et al. |
| 5,486,851 A | 1/1996 | Gehner et al. |
| 5,502,396 A | 3/1996 | Desarzens |
| 5,528,222 A | 6/1996 | Moskowitz |
| 5,546,889 A | 8/1996 | Wakita et al. |
| 5,569,879 A | 10/1996 | Gloton |
| 5,574,291 A | 11/1996 | Dodabalapur et al. |
| 5,578,513 A | 11/1996 | Maegawa |
| 5,580,794 A | 12/1996 | Allen |
| 5,625,199 A | 4/1997 | Baumbach et al. |
| 5,629,530 A | 5/1997 | Brown et al. |
| 5,630,986 A | 5/1997 | Charlton |
| 5,652,645 A | 7/1997 | Jain |
| 5,691,089 A | 11/1997 | Smayling |
| 5,693,956 A | 12/1997 | Shi |
| 5,705,826 A | 1/1998 | Aratani et al. |
| 5,729,428 A | 3/1998 | Sakata et al. |
| 5,854,139 A | 12/1998 | Aratani et al. |
| 5,869,972 A | 2/1999 | Birch et al. |
| 5,883,397 A | 3/1999 | Isoda et al. |
| 5,892,244 A | 4/1999 | Tanaka et al. |
| 5,946,551 A | 8/1999 | Dimitrakopoulos |
| 5,967,048 A | 10/1999 | Fromson et al. |
| 5,970,318 A | 10/1999 | Choi et al. |
| 5,973,598 A | 10/1999 | Beigel |
| 5,994,773 A | 11/1999 | Hirakawa |
| 5,997,817 A | 12/1999 | Crismore et al. |
| 5,998,805 A | 12/1999 | Shi et al. |
| 6,036,919 A | 3/2000 | Thym et al. |
| 6,045,977 A | 4/2000 | Chandross et al. |
| 6,060,338 A | 5/2000 | Tanaka et al. |
| 6,072,716 A | 6/2000 | Jacobson et al. |
| 6,083,104 A | 7/2000 | Choi |
| 6,087,196 A | 7/2000 | Sturm et al. |
| 6,133,835 A | 10/2000 | DeLeeuw et al. |
| 6,150,668 A | 11/2000 | Bao |
| 6,180,956 B1 | 1/2001 | Chondroudis |
| 6,197,663 B1 | 3/2001 | Chandross |
| 6,207,472 B1 | 3/2001 | Calligari et al. |
| 6,215,130 B1 | 4/2001 | Dodabalapur |
| 6,221,553 B1 | 4/2001 | Wolk |
| 6,251,513 B1 | 6/2001 | Rector |
| 6,284,562 B1 | 9/2001 | Batlogg et al. |
| 6,291,126 B2 | 9/2001 | Wolk et al. |
| 6,300,141 B1 | 10/2001 | Segal et al. |
| 6,321,571 B1 | 11/2001 | Themont et al. |
| 6,322,736 B1 | 11/2001 | Bao |
| 6,329,226 B1 | 12/2001 | Jones |
| 6,330,464 B1 | 12/2001 | Colvin |
| 6,335,539 B1 | 1/2002 | Dimitrakopoulos et al. |
| 6,336,017 B1 | 1/2002 | Miyamoto et al. |
| 6,340,822 B1 | 1/2002 | Brown et al. |
| 6,344,662 B1 | 2/2002 | Dimitrakopoulos et al. |
| 6,362,509 B1 | 3/2002 | Hart |
| 6,384,804 B1 | 5/2002 | Dodabalapur et al. |
| 6,403,396 B1 | 6/2002 | Gudesen et al. |
| 6,429,450 B1 | 8/2002 | Mutsaers et al. |
| 6,498,114 B1 | 12/2002 | Amundson et al. |
| 6,518,949 B2 | 2/2003 | Drzaic |
| 6,521,109 B1 | 2/2003 | Bartic et al. |
| 6,548,875 B2 | 4/2003 | Nishiyama |
| 6,555,840 B1 | 4/2003 | Hudson |
| 6,593,690 B1 | 7/2003 | McCormick |
| 6,603,139 B1 | 8/2003 | Tessler |
| 6,621,098 B1 | 9/2003 | Jackson |
| 6,517,955 B1 | 2/2005 | Jacobsen et al. |
| 6,852,583 B2 | 2/2005 | Bernds et al. |
| 6,903,958 B2 | 6/2005 | Bernds et al. |
| 6,960,489 B2 | 11/2005 | Bernds et al. |
| 7,078,937 B2 * | 7/2006 | Baude et al. ................ 326/112 |
| 7,223,995 B2 | 5/2007 | Fix et al. |
| 2001/0026187 A1 | 10/2001 | Oku |
| 2001/0046081 A1 | 11/2001 | Hayashi et al. |
| 2002/0018911 A1 | 2/2002 | Bernius et al. |
| 2002/0022284 A1 | 2/2002 | Heeger |
| 2002/0025391 A1 | 2/2002 | Angelopoulos |
| 2002/0053320 A1 | 5/2002 | Duthaler |
| 2002/0056839 A1 | 5/2002 | Joo et al. |
| 2002/0068392 A1 | 6/2002 | Lee et al. |
| 2002/0130042 A1 | 9/2002 | Moerman et al. |
| 2002/0170897 A1 | 11/2002 | Hall |
| 2002/0195644 A1 | 12/2002 | Dodabalapur et al. |
| 2003/0059987 A1 | 3/2003 | Sirringhaus et al. |
| 2003/0070500 A1 | 4/2003 | Hung |
| 2003/0112576 A1 | 6/2003 | Brewer et al. |
| 2003/0141807 A1 | 7/2003 | Kawase |
| 2003/0178620 A1 | 9/2003 | Bernds et al. |
| 2004/0002176 A1 | 1/2004 | Xu |
| 2004/0013982 A1 | 1/2004 | Jacobson et al. |
| 2004/0026689 A1 | 2/2004 | Bernds et al. |
| 2004/0084670 A1 | 5/2004 | Tripsas et al. |
| 2004/0119504 A1 | 6/2004 | Baude et al. |
| 2004/0211329 A1 | 10/2004 | Funahata et al. |
| 2004/0233065 A1 | 11/2004 | Freeman |
| 2004/0256467 A1 | 12/2004 | Clemens et al. |

FOREIGN PATENT DOCUMENTS

| | | |
|---|---|---|
| DE | 692 32 740 T2 | 4/1993 |
| DE | 42 43 832 | 6/1994 |
| DE | 43 12 766 | 10/1994 |
| DE | 196 29 291 | 1/1997 |
| DE | 195 06 907 | 9/1998 |
| DE | 198 52 312 | 5/1999 |
| DE | 198 16 860 | 11/1999 |
| DE | 199 18 193 | 11/1999 |
| DE | 198 51 703 | 5/2000 |
| DE | 100 06 257 | 9/2000 |
| DE | 199 21 024 | 11/2000 |
| DE | 199 33 757 | 1/2001 |
| DE | 695 19 782 | 1/2001 |
| DE | 199 35 527 | 2/2001 |
| DE | 199 37 262 | 3/2001 |
| DE | 100 12 204 | 9/2001 |
| DE | 100 33 112 | 1/2002 |
| DE | 201 11 825 | 2/2002 |
| DE | 100 43 204 | 4/2002 |
| DE | 100 45 192 | 4/2002 |
| DE | 100 47 171 | 4/2002 |
| DE | 100 58 559 | 5/2002 |
| DE | 100 61 297 | 6/2002 |
| DE | 101 17 663 | 10/2002 |
| DE | 101 20 687 | 10/2002 |
| DE | 101 20 686 | 11/2002 |
| DE | 101 51 440 | 2/2003 |
| DE | 101 41 440 | 3/2003 |
| DE | 101 63 267 | 7/2003 |
| DE | 102 09 400 | 10/2003 |
| DE | 10212640 | 10/2003 |
| DE | 102 19 905 | 12/2003 |
| DE | 103 41 962 | 4/2004 |
| DE | 699 13 745 | 10/2004 |
| EP | 0 108 650 | 5/1984 |

| | | | | | | |
|---|---|---|---|---|---|---|
| EP | 0 128 529 | | 12/1984 | WO | WO 98/40930 | 9/1998 |
| EP | 0 268 370 | A2 | 5/1988 | WO | WO 99/07189 | 2/1999 |
| EP | 0 268 370 | A3 | 5/1988 | WO | WO 99/10929 | 3/1999 |
| EP | 0 350 179 | | 1/1990 | WO | WO 99/10939 | 3/1999 |
| EP | 0 418 504 | | 3/1991 | WO | WO 99/21233 | 4/1999 |
| EP | 0 442 123 | | 8/1991 | WO | WO 99/30432 | 6/1999 |
| EP | 0 460 242 | | 12/1991 | WO | WO 99/39373 | 8/1999 |
| EP | 0 501 456 | A2 | 9/1992 | WO | WO 99/40631 | 8/1999 |
| EP | 0 501 456 | A3 | 9/1992 | WO | WO 99/53371 | 10/1999 |
| EP | 0 511 807 | | 11/1992 | WO | WO 99/54842 | 10/1999 |
| EP | 0 528 662 | | 2/1993 | WO | WO 99/54936 | 10/1999 |
| EP | 0 603 939 | A2 | 6/1994 | WO | WO 99/66540 | 12/1999 |
| EP | 0 615 256 | | 9/1994 | WO | WO 00/07151 | 2/2000 |
| EP | 0 685 985 | | 12/1995 | WO | WO 00/33063 | 6/2000 |
| EP | 0 716 458 | A2 | 6/1996 | WO | WO 00/36666 | 6/2000 |
| EP | 0 716 458 | A3 | 6/1996 | WO | WO 00/79617 | 12/2000 |
| EP | 0 785 578 | A2 | 7/1997 | WO | WO 01/03126 | 1/2001 |
| EP | 0 785 578 | A3 | 7/1997 | WO | WO 01/06442 | 1/2001 |
| EP | 0 786 820 | | 7/1997 | WO | WO 01/08241 | 2/2001 |
| EP | 0 690 457 | | 12/1999 | WO | WO 01/15233 | 3/2001 |
| EP | 0 962 984 | A2 | 12/1999 | WO | WO 01/17029 | 3/2001 |
| EP | 0 962 984 | A3 | 12/1999 | WO | WO 01/17041 | 3/2001 |
| EP | 0 966 182 | | 12/1999 | WO | WO 01/27998 | 4/2001 |
| EP | 0964516 | | 12/1999 | WO | WO 01/46987 | 6/2001 |
| EP | 0 979 715 | | 2/2000 | WO | WO 01/47044 A2 | 6/2001 |
| EP | 0 981 165 | | 2/2000 | WO | WO 01/47044 A3 | 6/2001 |
| EP | 0 989 614 | A2 | 3/2000 | WO | WO 01/47045 | 6/2001 |
| EP | 1 048 912 | | 11/2000 | WO | WO 01/69517 | 9/2001 |
| EP | 1 052 594 | | 11/2000 | WO | WO 01/73109 A2 | 10/2001 |
| EP | 1 065 725 | A2 | 1/2001 | WO | WO 01/73109 A3 | 10/2001 |
| EP | 1 065 725 | A3 | 1/2001 | WO | WO 02/05360 | 1/2002 |
| EP | 1 083 775 | | 3/2001 | WO | WO 02/05361 | 1/2002 |
| EP | 1 102 335 | A2 | 5/2001 | WO | WO 02/15264 | 2/2002 |
| EP | 1 103 916 | | 5/2001 | WO | WO 02/17233 | 2/2002 |
| EP | 1 104 035 | A2 | 5/2001 | WO | WO 02/19443 | 3/2002 |
| EP | 1 113 502 | | 7/2001 | WO | WO 02/21612 | 3/2002 |
| EP | 1 134 694 | | 9/2001 | WO | WO 02/29912 | 4/2002 |
| EP | 1 170 851 | | 1/2002 | WO | WO 02/43071 | 5/2002 |
| EP | 1 224 999 | | 7/2002 | WO | WO 02/47183 | 6/2002 |
| EP | 1 237 207 | | 9/2002 | WO | WO 02/065557 A1 | 8/2002 |
| EP | 1 296 280 | | 3/2003 | WO | WO 02/071139 | 9/2002 |
| EP | 1 318 084 | | 6/2003 | WO | WO 02/071505 | 9/2002 |
| FR | 2793089 | | 11/2000 | WO | WO 02/076924 | 10/2002 |
| GB | 723598 | | 2/1955 | WO | WO 02/091495 A2 | 11/2002 |
| GB | 2 058 462 | | 4/1981 | WO | WO 02/091495 A3 | 11/2002 |
| JP | 54069392 | | 6/1979 | WO | WO 02/095805 A2 | 11/2002 |
| JP | 60117769 | | 6/1985 | WO | WO 02/095805 A3 | 11/2002 |
| JP | 61001060 | | 1/1986 | WO | WO 02/099907 | 12/2002 |
| JP | 61167854 | | 7/1986 | WO | WO 02/099908 | 12/2002 |
| JP | 62065472 | A | 3/1987 | WO | WO 03/027948 | 4/2003 |
| JP | 362065477 | A | 3/1987 | WO | WO 03/036686 | 5/2003 |
| JP | 63205943 | | 8/1988 | WO | WO 03/038897 | 5/2003 |
| JP | 01169942 | | 7/1989 | WO | WO 03/046922 | 6/2003 |
| JP | 2969184 | | 12/1991 | WO | WO 03/057501 | 7/2003 |
| JP | 03290976 | A | 12/1991 | WO | WO 03/067680 | 8/2003 |
| JP | 05152560 | | 6/1993 | WO | WO 03/069552 | 8/2003 |
| JP | 05259434 | | 10/1993 | WO | WO 03/081671 | 10/2003 |
| JP | 05347422 | | 12/1993 | WO | WO 03/095175 | 11/2003 |
| JP | 08197788 | | 8/1995 | WO | WO 2004/032257 | 4/2004 |
| JP | 09083040 | | 3/1997 | WO | WO 2004/042837 A2 | 5/2004 |
| JP | 09320760 | | 12/1997 | WO | WO 2004/042837 A3 | 5/2004 |
| JP | 10026934 | | 1/1998 | WO | WO 2004/047144 A2 | 6/2004 |
| JP | 2001085272 | | 3/2001 | WO | WO 2004/047144 A3 | 6/2004 |
| WO | WO 93/16491 | | 8/1993 | WO | WO 2004/047194 A2 | 6/2004 |
| WO | WO 94/17556 | | 8/1994 | WO | WO 2004/047194 A3 | 6/2004 |
| WO | WO 95/06240 | | 3/1995 | WO | 2004068608 | 8/2004 |
| WO | WO 95/31831 | | 11/1995 | WO | WO 2004/083859 | 9/2004 |
| WO | WO 96/02924 | | 2/1996 | WO | WO 2005/004194 | 1/2005 |
| WO | WO 96/19792 | | 6/1996 | | | |
| WO | WO 97/12349 | | 4/1997 | | | |
| WO | WO 97/18944 | | 5/1997 | | | |
| WO | WO 98/18156 | | 4/1998 | | | |
| WO | WO 98/18186 | | 4/1998 | | | |

OTHER PUBLICATIONS

Klauk, H. et al., "Fast Organic Thin Film Transistor Circuits", IEEE Electron Device Letters, vol. 20, No. 6, pp. 289-291. 1999.

Zie Voor Title Boek, d 2e Pagina,XP-002189001, p. 196-204. 1986.
Garnier F et al:, "Vertical Devices Architecture By Molding Of Organic-Based Thin Film Transistor", Applied Physics Letters, American Institute Of Physics. XP000784120, issn: 0003-6951 abbildung 2. 1998.
U.S. Appl. No. 10/344,926, filed Feb. 12, 2004, Adolf Bernds et al., See attached Disclosure Statement.
U.S. Appl. No. 10/344,951, filed Feb. 12, 2004, Adolf Bernds et al.
U.S. Appl. No. 10/380,113, filed Sep. 25, 2003, Adolf Bernds et al.
U.S. Appl. No. 10/381,032, filed Feb. 12, 2004, Adolf Bernds et al.
U.S. Appl. No. 10/433,961, filed Apr. 1, 2004, Wolfgang Clemens et al.
U.S. Appl. No. 10/451,108, filed May 13, 2004, Mark Giles et al.
U.S. Appl. No. 10/473,050, filed May 20, 2004, Adolf Bernds et al.
U.S. Appl. No. 10/479,234, filed Dec. 30, 2004, Adolf Bernds et al.
U.S. Appl. No. 10/479,238, filed Oct. 20, 2004, Adolf Bernds et al.
U.S. Appl. No. 10/492,922, filed Mar. 3, 2005, Erwann Buillet et al.
U.S. Appl. No. 10/492,923, filed Dec. 23, 2004, Wolfgang Clemens et al.
U.S. Appl. No. 10/508,737, filed May 19, 2005, Adolf Bernds et al.
U.S. Appl. No. 10/517,750, filed Oct. 13, 2005, Wolfgang Clemens et al.
U.S. Appl. No. 10/523,216, filed Feb. 2, 2006, Adolf Bernds et al.
U.S. Appl. No. 10/523,487, filed Apr. 13, 2006, Wolfgang Clemens et al.
U.S. Appl. No. 10/524,646, filed May 11, 2006, Walter Fix et al.
U.S. Appl. No. 10/533,756, filed Jun. 8, 2006, Wolfgang Clemens et al.
U.S. Appl. No. 10/534,678, filed Jun. 8, 2006, Wolfgang Clemens et al.
U.S. Appl. No. 10/535,448, filed Jun. 8, 2006, W. Clemens et al.
U.S. Appl. No. 10/535,449, Feb. 16, 2006, Walter Fix et al.
U.S. Appl. No. 10/344,926, filed Feb. 12, 2004, Adolf Bernds et al.
U.S. Appl. No. 10/541,815, filed Jun. 8, 2006, Axel Gerlt et al.
U.S. Appl. No. 10/541,956, Wolfgang Clemens et al.
U.S. Appl. No. 10/541,957, filed Jul. 6, 2006, Walter Fix et al.
U.S. Appl. No. 10/543,561, Wolfgang Clemens et al.
U.S. Appl. No. 10/542,678, Adolf Bernds et al.
U.S. Appl. No. 10/542,679, filed Mar. 16, 2006, Adolf Bernds et al.
U.S. Appl. No. 10/562,989, Jurgen Ficker et al.
U.S. Appl. No. 10/562,869, Wolfram Glauert.
U.S. Appl. No. 10/569,763, Walter Fix et al.
U.S. Appl. No. 10/568,730, Wolfgang Clemens et al.
U.S. Appl. No. 10/569,233, Adolf Bernds et al.
U.S. Appl. No. 10/570,571, Clemens et al.
U.S. Appl. No. 10/585,775, Walter Fix et al.
U.S. Appl. No. 11/574,139, Jurgen Ficker et al.
U.S. Appl. No. 11/721,284, Markus Bohm et al.
U.S. Appl. No. 11/721,219, Wolfgang Clemens et al.
U.S. Appl. No. 11/721,244, Robert Blache et al.
U.S. Appl. No. 11/722,457, Markus Bohm et al.
U.S. Appl. No. 11/817,258, Andreas Ullmann et al.
U.S. Appl. No. 11/817,329, Andreas Ullmann et al.
Angelopoulos M et al., "In-Situ Radiation Induced Doping", Mol. Crystl. Liq. Cryst., 1990, vol. 189, pp. 221-225.
Assadi A, et al:, Field-Effect Mobility of Poly (3-Hexylthiophene) Dept. of Physics and Measurement Technology, Received Mar. 3, 1988; accepted for Publication May 17, 1988.
Bao, Z. et al., "High-Performance Plastic Transistors Fabricatecd by Printing Techniques", Chem. Mater vol. 9, No. 6, 1997, pp. 1299-1301.
Bao, Z. et al. "Organic and Polymeric Materials for the Fabrications of Thin Film Field-Effect Transistors", paper presented at the meeting of American Chemical Society, Division of Polymer Chemistry, XX, XX, vol. 39, No. 1, Mar. 29, 1998.
Baude P F et al, "Organic semiconductor RFID transponsers" International Electron Devices Meeting 2003. IEDM. Technical Digest. Washington, DC, Dec. 8-10, 2003, New York NY, IEEE, US Dec. 8, 2003, pp. 191-194.
Belloni, F. et al, "Parameters Optimization for Improved Dynamics of Voltage Multipliers for Space", 2004 35$^{th}$ Annual IEEE Electronics Specialists Conference, Aachen, Germany, 2004, pp. 439-442.

Bonse M. et al., "Integrated a-Si:H/Pentacene Inorganic Organic Complementary Circuits" in IEEE, IEDM 98, pp. 249-252.
Brabec, C.J. et al, "Photoinduced FT-IR spectroscopy and CW-photocurrent measurements of conjugated polymers and fullerenes blended into a conventional polymer matrix", Solar Energy Materials and Solar Cells, 2000 Elsevier Science V.V., pp. 19-33.
Brabec, C.J. et al., "Photovoltaic properties of a conjugated polymer/methanofullerene composites embedded in a polystyrene matrix", Journal of Applied Physics, vol. 85, No. 9, 1999, pp. 6866-6872.
Braun D., et al, "Visible light emission from semiconducting polymer diodes", American Institute of Physics, Applied Physics Letters 58, May 6, 1991, pp. 1982-1984.
Brown, A.R. et al., "Field-effect transistors made from solution-processed organic semiconductors", Elsevier Science, S.A., Synthetic Metals 88 (1997) pp. 37-55.
Brown, A.R., "Logic Gates Made from Polymer Transistors and Their Use in Ring Oscillators", Science, vol. 270, Nov. 10, 1995, pp. 972-974.
Chen, Shiao-Shien et al:, "Deep Submicrometer Double-Gate Fully-Depleted SOI PMOS Devices: A Concise Short-Channel Effect Threshold Voltage Model Using a Quasi-2D Approach", IEEE Transaction on Electron Devices, vol. 43, No. 9, Sep. 1996.
Chen, X.L. et al., "Morphological and Transistor Studies of Organic Molecular Semiconductors with Anisotropic Electrical Characteristics", American Chemical Society, 2001, Chem. Mater. 2001, 13, 1341-1348.
Clemens, W. et al., "Vom Organischen Transistor Zum Plastik-Chip," Physik Journal, V. 2, 2003, pp. 31-36.
Collet J. et al:, 'Low Voltage, 30 NM Channel Length, Organic Transistors With a Self-Assembled Monolayer as Gate Insulating Films:, Applied Physics Letters, American Institute of Physics. New York, US, Bd 76, Nr. 14, Apr. 3, 2000, Seiten 1941-1943, XP000950589, ISSN:0003-6951, das ganze Dokument.
Cox, Robert W. et al., "A Minimally Intrusive, Low Cost System for Determining Indoor Air Flow Patterns", Computers In Power Electronics, 2004. IEEE Workshop on Urbana, IL Aug. 15-18, 2004, Piscataway, NJ, IEEE, Aug. 15, 2004, pp. 63-68.
Crone, B. et al, "Large-scale complementary Integrated circuits based on Organic transistors", Nature, vol. 403, Feb. 3, 2000, pp. 521.
Crone B. K. et al., "Design and Fabrication of Organic Complementary Circuits", J. Appl. Phys. vol. 89, May 2001, pp. 5125-5132.
Dai, L. et al, Photochemical Generation of Conducting Patterns in Polybutadiene Films:, Macromolecules, vol. 29, No. 1, 1996, pp. 282-287, XP 001042019, the whole document.
Dai, L. et al., "Conjugation of Polydienes by Oxidants Other Than Iodine", Elsevier Science S.A., Synthetic Metals 86 (1997) 1893-1894.
Dai, L. et al., "$I_2$-Doping" of 1,4-Polydienes, Elsevier Science S.A., Synthetic Metals 69 (1995), pp. 563-566.
De Leeuw C.M. et al., "Polymeric integrated circuits and light-emitting diodes", Electron Devices Meeting, 1997. Technical Digest, International, Washington, DC, USA Dec. 7-10, 1997, New York, NY, USA, IEEE, US Dec. 7, 1997.
Dodabalapur, A. et al., Organic smart pixels, American Institute of Physics, Applied Physics Letters, vol. 73, No. 2, Jul. 13, 1998, pp. 142-144.
Drury et al., "Low-Cost All-Polymer Integrated Circuits", American Institute of Physics, Applied Physics Letters, 1998, vol. 73, No. 1, pp. 108-110, Jul. 6, 1998.
Ficker, J. et al., "Dynamic and Lifetime Measurements of Polymer OFETS and Integrated Plastic Circuits," Proc. of SPIE, v. 466, 2001, pp. 95-102.
Fix, W. et al., "Fast Polymer Integrated Circuits Based on a Polyfluorene Derivative", ESSDERC 2002, 2002, pp. 527-529.
Fix, W., et al., "Fast polymer integrated circuits", American Institute of Physics, Applied Physics Letters, vol. 81, No. 89, Aug. 2002, pp. 1735-1737.
Forrest et al.: "The Dawn of Organic Electronics", IEEE Spectrum, Aug. 2000, Seiten 29-34, XP002189000, IEEE Inc., New York, US ISSN:0018-9235, Seite 33, rechte Spalte, Zelle 58-Seite 34, linke Spalte, Zeile 24; Abbildung 5.

Fraunhofer Magazin- Polytronic Chips Von der Rolle, Apr. 2001, pp. 8-13.

Garbassi F., et al., "Bulk Modifications", Polymer Surfaces, John Wiley & Sons, 1998, pp. 289-300.

Garnier, F. et al, "All-Polymer Field-Effect Transistor Realized by Printing Techniques", Science, American Association for the Advancement of Science, US, vol. 265, Sep. 16, 1994, pp. 1684-1686.

Garnier et al., "Conjugated Polymers and Oligomers as Active Material For Electronic Devices", Synthetic Metals, vol. 28, 1989.

Gelinck, G.H. et al., "High-Performance All-Polymer Integrated Circuits", Applied Physics Letters, v. 77, 2000, pp. 1487-1489.

Goncalves_Conto, Sylvie, et al., "Interface Morphology in Organic Light-Emitting Diodes", Advanced Materials 1999, vol. 11, No. 2, pp. 112-115.

Gosain, D.P., "Excimer laser crystallized poly-Si TFT's on plastic substrates", Second International Symposium on Laser Precision Microfabrication, May 16-18, 2001, Singapore, vol. 4426, pp. 394-400.

Halls, J.J. M., et al., "Efficient photodiodes from interpenetrating polymer networks", Nature, vol. 376, Aug. 10, 1995, pp. 498-500.

Harsanyi G. et al, "Polytronics for biogtronics:unique possibilities of polymers in biosensors and BioMEMS", IEEE Polytronic 2002 Conference, Jun. 23, 2002, pp. 211-215.

Hart, C.M. et al, "Low-cost all-polymer integrated circuits", Solid-State Circuits Conference, 1998. EXXCIRC '98 Proceedings of the 24$^{th}$ European, The Hague, The Netherlands Sep. 22-24, 1998, Piscataway, NJ, USA, IEEE, Sep. 22, 1998, pp. 30-34.

Hebner, T.R. et al., Ink-jet printing of doped polymers for organic light emitting devices:, American Institute of Physics, Applied Physics Letters, vol. 72, No. 5, Feb. 2, 1998, pp. 519-521.

Hergel, H. J.: "Pld-Programmiertechnologien", Elektronik, Franzis Verlag GMBH. Munchen, DE, Bd 41, Nr. 5, Mar. 3, 1992, Seiten 44-46, XP000293121, ISSN: 0013-5658, Abbildungen 1-3.

Hwang J D et al:, "A Vertical Submicron Slc thin film transistor", Solid State Electronics, Elsevier Science Publishers, Barking, GB, Bd. 38, NR. 2, Feb. 1, 1995, Seiten 275-278, XP004014040, ISSN:0038-1101, Abbildung 2.

IBM Technical Disclosure Bulletin, "Short-Channel Field-Effect Transistor", IBM Corp., New York, US, Bd. 32, Nr. 3A, Aug. 1, 1989, Seiten 77-78, XP000049357, ISSN:0018-8689, das ganze Dokument.

Kawase, T., et al., "Inkjet Printed Via-Hole Interconnections and Resistors for All-Polymer Transistor Circuits", Advanced Materials 2001, 13, No. 21, Nov. 2, 2001, pp. 1601-1605.

Klauk, H. et al., "Pentacene Thin Film Transistors and Inverter Circuits", 1997 International Electron Devices Meeting Technical Digest, pp. 539-542, Dec. 1997.

Knobloch, A. et al., "Printed Polymer Transistors", Proc. Polytronic, v. 84, 2001, pp. 84-89.

Kobel W. et al., "Generation of Micropatterns in Poly (3-Methyl-Thiophene) Films Using Microlithography: A First Step in the Design of an All-Organic Thin-Film Transistor" Synthetic Metals, V. 22, 1988, pp. 265-271.

Koezuka, H. et al., "Macromolecular Electronic Device", Mol. Cryst. Liq. Cryst. 1994, vol. 2555, pp. 221-230.

Kumar, Anish et al:, "Kink-Free Polycrystalline Silicon Double-Gate Elevated-Channel Thin-Film Transistors", IEEE Transactions on Electron Devices, vol. 45, No. 12, Dec. 1998.

Lidzey, D. G. et al., "Photoprocessed and Micropatterned Conjugated Polymer LEDs", Synthetic Metals, V. 82, 1996, pp. 141-148.

Lowe, J. et al., "Poly (3-(2-Acetoxyethyl)Thiophene): A Model Polymer for Acid-Catalyzed Lithography", Synthetic Metals, Elsevier Sequoia, Lausanne, CH, Bd. 85, 1997, Seiten 1427-1430.

Lu, Wen et al., "Use of Ionic Liquids for π-Conjugated Polymer Electrochemical Devices", Science, vol. 297, 2002, pp. 983-987/.

Lucent Technologies, "Innovation marks significant milestone in the development of electronic paper", Cambridge, MA and Murray Hill, NJ, Nov. 20, 2000. XP-002209726.

Manuelli, Alessandro et al., "Applicability of Coating Techniques for the Production of Organic Field Effect Transistors", IEEE Polytronic 2002 Conference, 2002, pp. 201-204.

Marko, H., Vorlesungsmanuskript "Nachrichtentechnik 2 (Modulationsverfahren)" des Lehrstuhls fur Nachrichtentechnik der Technischen Universitat Munchen, 1989.

Miyamoto, Shoichi et al:, Effect of LDD Structure and Channel Poly-Si Thinning on a Gate-All-Around TFT (GAT) for SRAM's, IEEE Transactions on Electron Devices. vol. 46, No. 8, Aug. 1999.

Nalwa, H.S., "Organic Conductive Molecules and Polymers", vol. 2, 1997, pp. 534-535.

Oelkrug, D. et al., "Electronic spectra of self-organized oligothiophene films with 'standing' and 'lying' molecular units", Elsevier Science S.A., 1996, Thin Solid Films 284-270.

Qiao, X. et al., "The FeCl3-doped poly3-alkithiophenes) in solid state", Elsevier Science, Synthetic Metals 122 (2001) pp. 449-454.

Redecker, M. et al., "Mobility enhancement through homogeneous nematic alignment of a liquid-crystalline polyfluorene", 1999 American Institute of Physics, Applied Physics Letters, vol. 74, No. 10, pp. 1400-1402.

Rogers J A et al:, "Low-Voltage 0.1 Mum Organic Transistors and Complementary Inverter Circuits Fabricated with a Low-Cost Form of Near-Field Photolithography", Applied Physics Letters, American Institute of Physics. New York, US, Bd. 75, Nr. 7, Aug. 16, 1999, Seiten 1010-1012, XP000934355, ISSN: 003-6951, das ganze Dokument.

Rogers, J. A. et al:, "Printing Process Suitable for Reel-to-Reel Production of High-Performance Organic Transistors and Circuits", Advanced Materials, VCH, Verlagsgesellschaft, Weinheim, DE, Bd. 11, Nr. 9, Jul. 5, 1999, Seiten 741-745, P000851834, ISSN: 0935-9648, das ganze Dokument.

Roman et al., "Polymer Diodes With High Rectification", Applied Physics Letters, vol. 75, No. 21, Nov. 22, 1999.

Rost, Henning et al., "All-Polymer Organic Field Effect Transistors", Proc. Mat. Week, CD, 2001, pp. 1-6.

Sandberg, H. et al, "Ultra-thin Organic Films for Field Effect Transistors", SPIE vol. 4466, 2001, pp. 35-43.

Schoebel, "Frequency Conversion with Organic-On-Inorganic Heterostructured Diodes", Extended Abstracts of the International Conference on Solid State Devices and Materials, Sep. 1, 1997.

Shaheen, S.E., et al., "Low band-gap polymeric photovoltaic devices", Synthetic Metals, vol. 121, 2001, pp. 1583-1584.

Speakman, S.P. et al., High performance organic semiconducting thin films: Ink Jet printed polythophene [π-P3HT], Organic Electronics 2 (2), 2001, pp. 65-73.

Takashima, W. et al., Electroplasticity Memory Devices Using Conducting Polymers and Solid Polymer Electrolytes, Polymer International, Melbourne, 1992, pp. 249-253.

Ullman, A. et al., "High Performance Organic Field-Effect Transistors and Integrated Inverters", Mat. Res. Soc. Symp. Proc., v. 665, 2001, pp. 265-270.

Velu, G. et al. "Low Driving Voltages and Memory Effect in Organic Thin-Film Transistors With A Ferroelectric Gate Insulator", Applied Physics Letters, American Institute of Physics, New York, vol. 79, No. 5, 2001, pp. 659-661.

Wang, Hsing et al., "Conducting Polymer Blends: Polythiophene and Polypyrrole Blends with Polystyrene and Poly(bisphenol A carbonate)", Macromolecules, 1990, vol. 23, pp. 1053-1059.

Wang, Yading et al., "Electrically Conductive Semiinterpenetrating Polymer Networks of Poly(3-octylthiophene)", Macromolecules 1992, vol. 25, pp. 3284-3290.

Yu, G. et al., "Dual-function semiconducting polymer devices: Light-emitting and photodetecting diodes", American Institute of Physics, Applied Physics Letter 64, Mar. 21, 1994, pp. 1540-1542.

Zangara L., "Metall Statt Halbleiter, Programmierung Von Embedded ROMS Ueber Die Metallisierungen", Elektronik, Franzis Verlag GmbH, Munchen, DE, vol. 47, No. 16, Aug. 4, 1998, pp. 52-55.

Zheng, Xiang-Yang et al., "Electrochemical Patterning of the Surface of Insulators with Electrically Conductive Polymers", J. Electrochem. Soc., v. 142, 1995, pp. L226-L227.

\* cited by examiner

ORGANIC CLOCK GENERATOR

The invention relates to an electronic module having organic components, in particular an RFID transponder (RFID=Radio Frequency Identification).

RFID transponders are increasingly being used to provide goods, articles or security products with information which can be read electronically. They are thus used, for example, as electronic bar code for consumer goods, as a luggage tag for identifying luggage or as a security element which is incorporated in the cover of a passport and stores authentication information.

RFID transponders usually comprise two components, an antenna and a silicon chip. The RF carrier signal transmitted by the base station is injected into the antenna resonant circuit of the RFID transponder. The silicon chip modulates an additional item of information onto the signal which is fed back to the base station. In this case, modulation is controlled by an ID code generator which is implemented on the silicon chip using digital circuit technology. In this case, the circuit clock rate for the electronic circuits on the silicon chip is directly derived from the frequency of the radio signal received by the antenna.

The digital circuits on the silicon chip are therefore operated in synchronism with the radio carrier frequency.

In order to be able to reduce the costs of producing RFID transponders, it has been proposed to use organic integrated circuits based on organic field effect transistors in RFID transponders WO 99/304 32, for example, thus proposes using an integrated circuit, which is essentially constructed from organic material and provides the function of an ID code generator, in an RFID transponder.

For carrier frequencies of greater than 10 MHz, in particular in the region of 13.56 MHz which is of particular interest for RFID transponders and in the UHF band above 900 MHz, it is currently not possible to operate organic circuits of RFID transponders in synchronism with the radio carrier frequency, as is customary in the case of silicon RFID transponders. On account of the restricted charge carrier mobility and the resultant switching times, organic logic circuits are currently too slow to operate in synchronism with the carrier frequency at such high switching frequencies.

In addition, a multiplicity of clock generators which provide a clock signal for the purpose of operating logic circuits, in particular processors, are known. Such clock generators usually have a resonant circuit from which the clock signal is derived.

The invention is now based on the object of specifying an improved electronic module having organic components.

The object of the invention is achieved by an electronic module having organic components, in particular by an RFID transponder, which module has a clock generator and a first electronic circuit, the clock generator having n organic switching elements which are connected in series and are each constructed from organic components, in particular from organic field effect transistors, the output of the nth organic switching element of the clock generator being connected to the input of the first organic switching element of the clock generator, and the outputs of two or more of the organic switching elements of the clock generator being connected to respective inputs of the first electronic circuit for the purpose of tapping off two or more clock signals, with the result that a first clock signal for the first electronic circuit is tapped off from the output of a first one of the switching elements and a second clock signal, which is phase-shifted with respect to the first clock signal, for the first electronic circuit is tapped off from the output of a second switching element which differs from the first switching element.

A module which comprises organic components and generates a periodically circulating signal is thus used as a clock generator. Output signals for the first electronic circuit are tapped off from two or more points in the chain, said output signals, on account of their properties (phase offset), allowing the outlay on components for implementing the function of the first circuit to be reduced or allowing more complex data signals which could otherwise only be generated using more complex logic modules, such as counters or decoder circuits, to be generated with little outlay on components.

Particular advantages result when the invention is used in the field of RFID transponders. A separate circuit clock rate which is independent of the radio carrier frequency is generated inside the organic circuit of the RFID transponder using the clock generator. The organic circuit of the RFID transponder is then operated asynchronously to the carrier frequency of the radio path at this clock rate which is specifically generated for this purpose. The output signal from the circuit is then used to modulate the radio signal. This makes it possible to clock the organic circuit part of the RFID transponder in a completely asynchronous manner to the carrier frequency.

The periodic output signals produced in this arrangement are optimally matched to the switching speed of organic circuits and may therefore be optimally used as clock signals, for example for the organic circuit of an RFID transponder. In this case, the frequency and phase angles of the clock signals are essentially dependent only on the design of the clock generator module described above (length of the chain, component geometry etc.) but not on the carrier frequency of the radio path of the RFID transponder.

Advantageous developments of the invention are described in the subclaims.

The first electronic circuit is preferably a logic circuit which is constructed from organic components. As already explained above, the output signals from the clock generator are optimally matched to the switching speed of organic circuits, with the result that the two or more clock signals derived from the clock generator can be used to implement a multiplicity of functions which could otherwise only be implemented with a considerably higher outlay on components or could not be implemented at all.

According to one preferred exemplary embodiment of the invention, the first electronic circuit in this case has one or more logic gates which are constructed from organic components and logically combine the two or more clock signals supplied and thus generate one or more output signals for a second electronic circuit which is likewise preferably a logic circuit which is constructed from organic components. More complex signals, for example asymmetrical signals, which could otherwise only be generated using complex circuits or—on account of the restricted charge carrier mobility and resultant switching times of organic components—could not be generated at all using organic circuit technology can be obtained in this manner using simple circuits having only a few logic gates. It is thus possible, for example, to generate data signals or addressing signals for organic logic circuits at a very high circuit clock rate and with very little delay, which signals could not be generated in another manner using organic components, at least not at such a high circuit clock rate and/or delay. Accordingly, the invention can also be used to improve and speed up information processing by organic digital circuits.

Two clock signals are preferably tapped off from switching elements of the clock generator, said switching elements being at a distance of INT (n/2) switching elements from one another, in which case n should preferably be selected to be even. Two clock signals which are phase-shifted through 90° relative to one another can be generated in this manner.

According to one preferred exemplary embodiment of the invention, second clock signals are combined in the first electronic circuit using a NOR gate or an AND gate in order to generate an asymmetrical pulsed output signal. The pulse width of the pulses of the output signal is determined in this case by the number of organic switching elements arranged between the tapping points of the clock signals, with the result that the relative position of the two tapping points with respect to one another is selected in such a manner that the desired pulse width of the pulses of the output signal results. The asymmetrical signals generated in this manner make it possible to distinguish between the useful signal and the unavoidable noise during radio transmission in a simpler manner, with the result that advantages result during operation of an RFID transponder as a result of the use of a clock signal which has been generated in this manner.

According to another preferred exemplary embodiment of the invention, the outputs of three or more of the organic switching elements of the clock generator are connected to respective inputs of the first electronic circuit for the purpose of tapping off three or more clock signals which are phase-shifted with respect to one another. The first electronic circuit has two or more logic gates which are constructed from organic components and combine the three or more clock signals in order to generate two or more output signals having pulses which do not overlap. These output signals can be used, for example, to address memory locations. In this case, the addressing signals can be generated with very little outlay on components. The three or more clock signals which are phase-shifted with respect to one another are thus combined in pairs, for example, using a logic gate, and the number of electronic switching elements arranged between the respective tapping points of the clock signals is selected in such a manner that the two or more output signals have pulses which do not overlap.

In order to generate more complex addressing or data signals, the first electronic circuit is in the form of a two-stage or multistage logic circuit, very complex signal forms which can be used, for example, as ID information of an RFID transponder also being able to be realized in this case with very little outlay on components.

In comparison with the otherwise usually used traditional generation of such signals using counter and decoder circuits, the practice of directly generating these more complex signals from the combination of a plurality of phase-shifted clock signals has the advantage that it requires considerably fewer components than these relatively complex modules. This reduces the amount of space required and thus increases the yield of the organic circuits.

The electronic module according to the invention can be used to provide a multiplicity of functions and is not restricted to use in an RFID transponder. In this case, particular advantages result if the electronic module is manufactured in the form of a flexible film element which is used as a security element for protecting valuable documents, for example banknotes or passports, or for protecting goods.

The invention is explained by way of example below using a plurality of exemplary embodiments and with the aid of the accompanying drawings.

Figure 1:
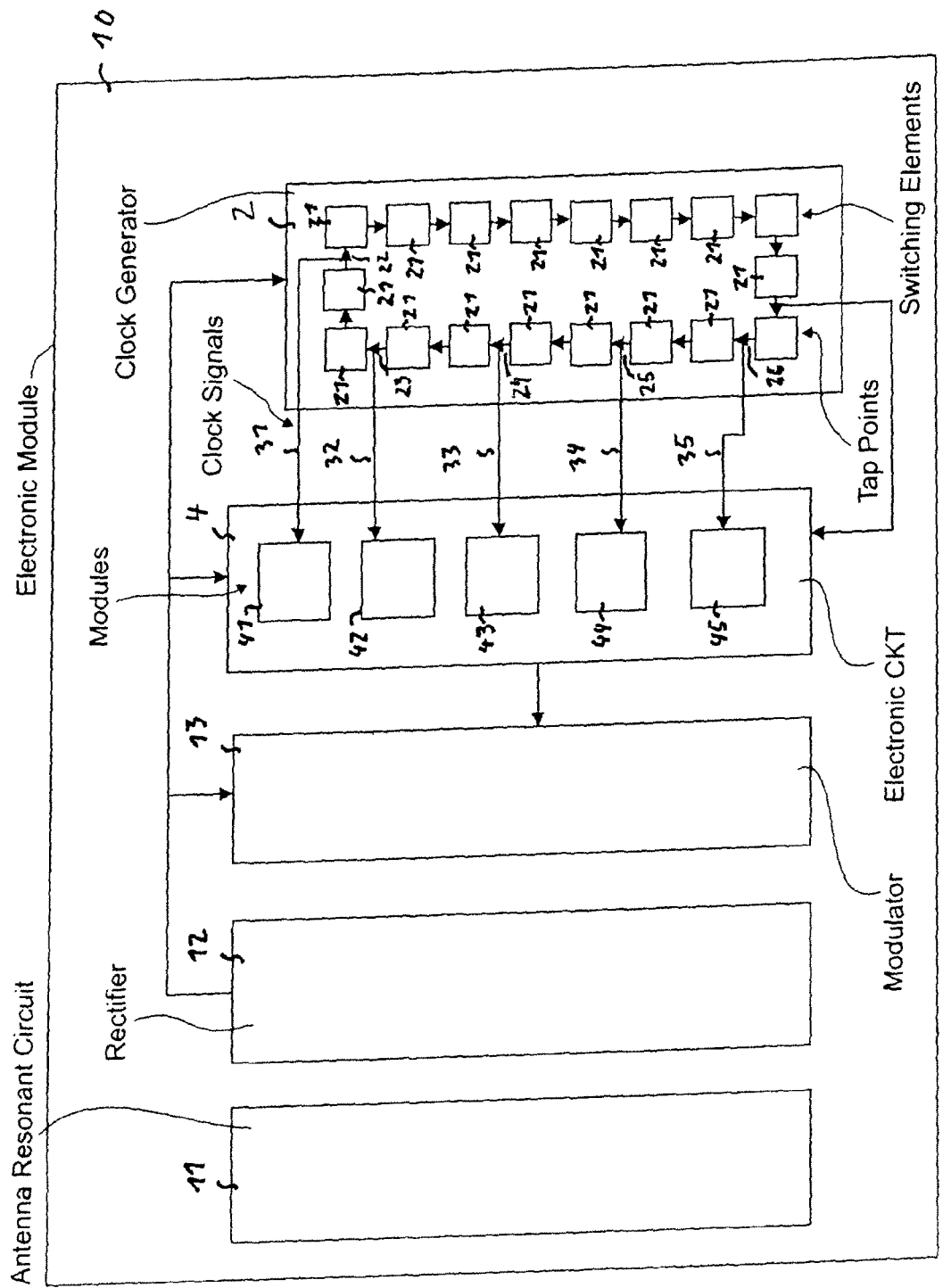
FIG. 1 shows a functional illustration of an electronic module according to the invention.

FIG. 1 shows an electronic module 10 which is a flexible, multilayer film body having one or more electrical functional layers. The electrical functional layers of the film body comprise (organic) conductive layers, organic semiconducting layers and/or organic insulating layers which, at least partly in structured form, are arranged above one another. In addition to these electrical functional layers, the multilayer film body optionally also comprises one or more carrier layers, protective layers, decorative layers, adhesion-promoting layers or adhesive layers. The electronically conductive functional layers preferably comprise a conductive, structured metallization, preferably composed of gold or silver. However, provision may also be made for forming these functional layers from an inorganic electrically conductive material, for example from indium tin oxide or from a conductive polymer, for example from polyaniline or polypyrrole. The organically semiconducting functional layers comprise, for example, conjugated polymers such as polythiophenes, polythienylenevinylenes or polyfluorene derivatives which are applied as a solution by means of spin-coating, blade coating or printing. So-called "small molecules", that is to say oligomers such as sexithiophene or pentacene, which are vapor-deposited by means of a vacuum technique, are also suitable as the organic semiconductor layer. These organic layers are preferably applied in a manner already structured partially or in patterned fashion by means of a printing method (intaglio printing, screen printing, pad printing). For this purpose, the organic materials provided for the layers are in the form of soluble polymers, the term polymer also including oligomers and "small molecules" in this case, as already described above.

In this case, the electrical functional layers of the film body are configured in such a manner that they realize the functions explained below.

According to a first exemplary embodiment of the invention, the electronic module 10 is used as an RFID transponder.

From a functional point of view, the electronic module 10 has an antenna resonant circuit 11, a rectifier 12, a modulator 13, an electronic circuit 4 and a clock generator 2 for this purpose. The rectifier 12 provides the supply voltage for the modulator 3, the electronic circuit 4 and the clock generator 2. The clock generator 2 provides the switching clock rate for the electronic circuit 4 and continues to also supply the electronic circuit 4 with a plurality of clock signals 31 to 35 which are phase-shifted with respect to one another. The electronic circuit generates the control signal for the modulator 13 and provides, for example, the function of an ID code generator or a control module which uses a specific communication protocol to interchange authorization or identification information with a corresponding base station via the air interface by driving the modulator 13.

Figure 2:
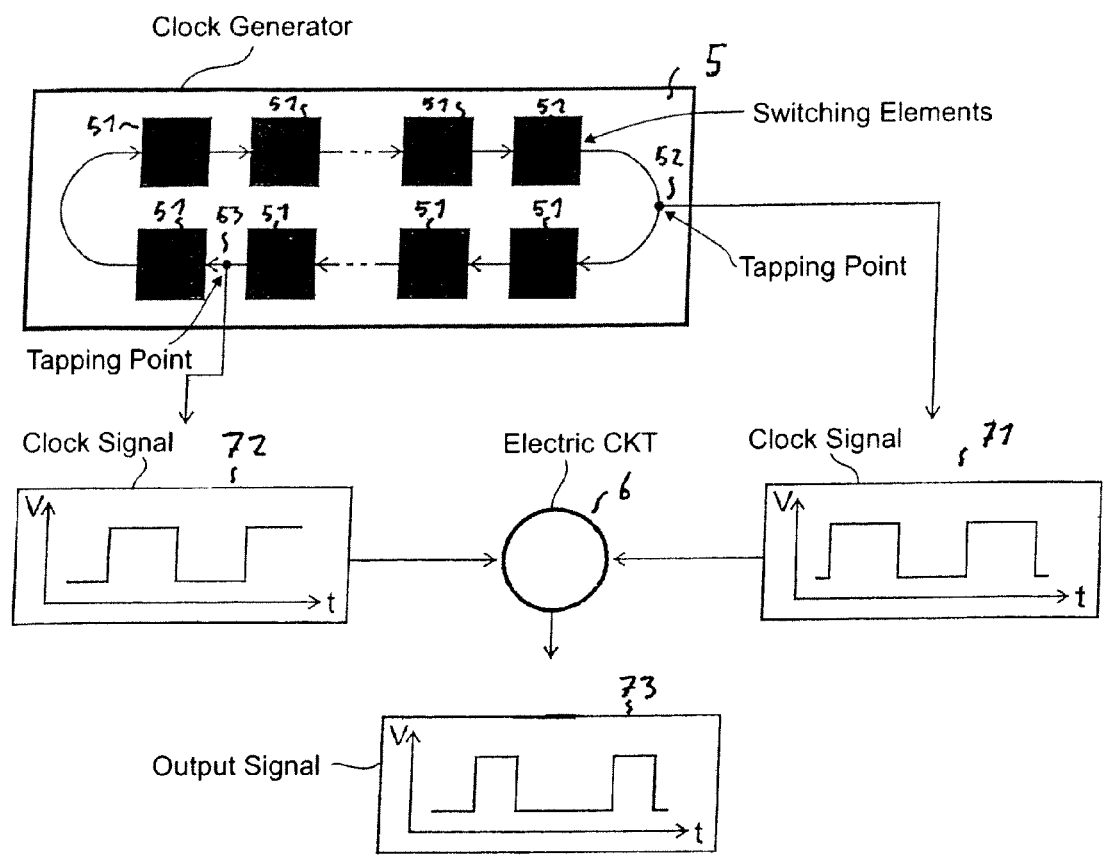
FIG. 2 shows a functional illustration of an electronic module according to the invention for another exemplary embodiment of the invention.

As indicated in FIG. 1, the clock generator 2 comprises an annular arrangement of identical organic switching elements 21 which are each constructed from organic components. As illustrated in FIG. 2, the output of one of the organic switching elements 21 is respectively connected to the input of the following organic switching element 21 and the input of the organic switching element 21 is connected to the output of the preceding organic switching element 21.

The organic switching elements 21 are preferably a respective inverter which is constructed from organic components.

Figure 3:
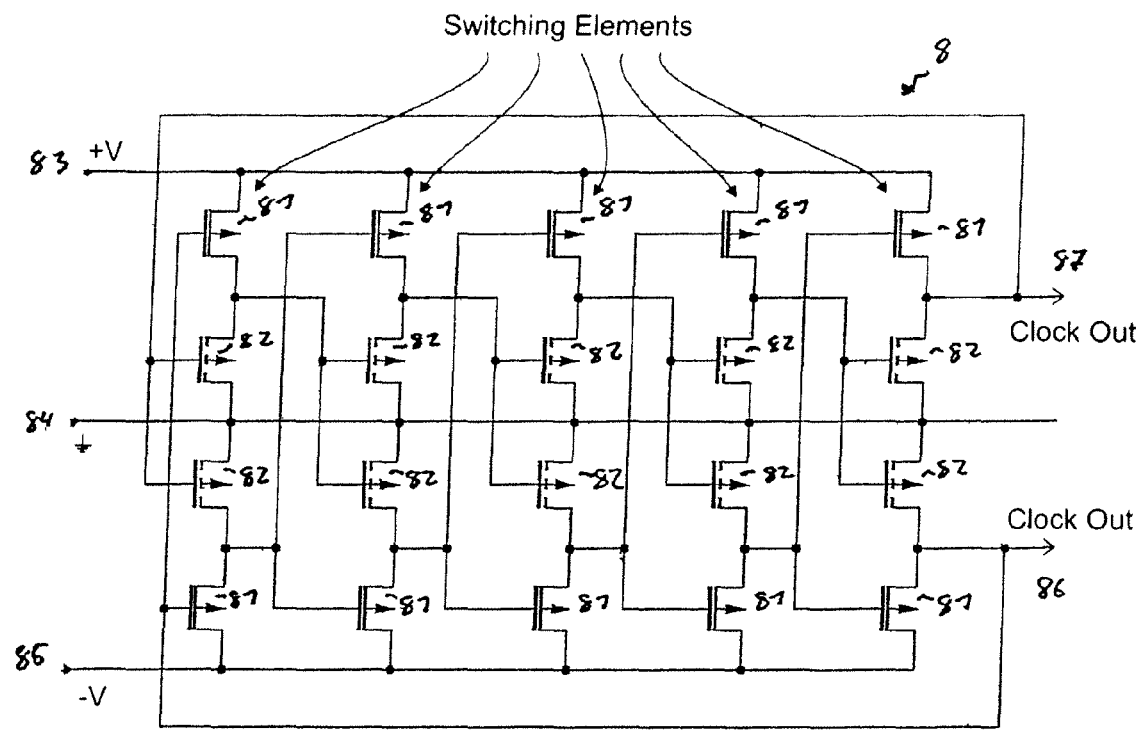
FIG. 3 shows a circuit diagram of a clock generator module for an electronic module according to FIG. 1 or FIG. 2.
Figure 4:
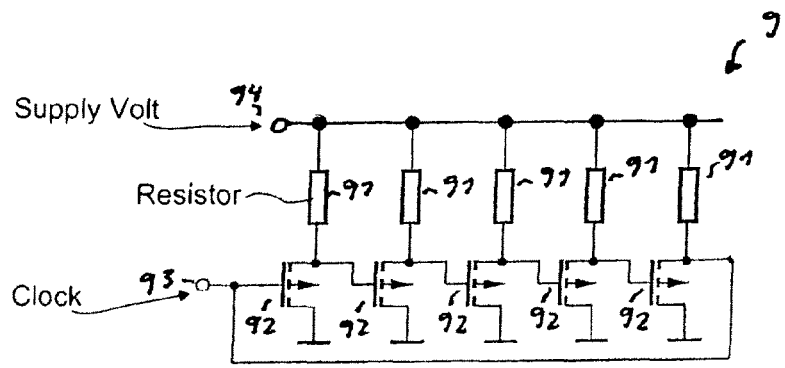
FIG. 4 shows a circuit diagram of a clock generator module for an electronic module according to FIG. 1 or FIG. 2.

FIG. 3 and FIG. 4 show examples of the circuit implementation of such an annular arrangement of similar organic switching elements.

For example, FIG. 4 illustrates an annular arrangement comprising five inverter circuits which are each constructed from a resistor 91 and an organic field effect transistor 92. In this case, the circuit has a connection 94 for the supply voltage and a clock connection 93.

FIG. 3 shows an annular arrangement of organic switching elements which are connected in series and are each formed from four organic field effect transistors 81 and 82. The circuit according to FIG. 3 has a connection 83 for a positive operating voltage, a connection 85 for a negative operating voltage, a ground connection 84 and a clock output having the connections 87 and 86. In this case, the circuit according to FIG. 3 uses field effect transistors 81 and 82 having current channels of different conductivity. The changeover operation is effected by applying a negative gate voltage to the field effect transistor having the current channel of poorer conductivity and simultaneously applying a positive gate voltage to the organic field effect transistor having the current channel of better conductivity.

The clock frequency of a clock signal that is tapped off from the clock generator 2 according to FIG. 1 is thus solely determined by the number of organic switching elements 21 and by the switching speed of the organic components 21 which is essentially determined from the circuit configuration (see FIG. 3, FIG. 4) and the design of the organic field effect transistors used for this purpose.

The clock signals 31 to 35 which are supplied to respective modules 41 to 45 of the electronic circuit 4 are tapped off in this case from the outputs of different organic switching elements 21. The clock signals 31 to 35 are thus tapped off from the tapping points 22 to 26. The clock signals 31 to 35 are thus at the same clock frequency but have a different phase angle which is determined by the number of organic switching elements 21 arranged between the respective tapping points.

FIG. 2 shows a clock generator 5 and an electronic circuit 6. The clock generator 5 is constructed from n organic switching elements 51 which are concatenated with one another in annular form, as indicated in FIG. 2. The organic switching elements may be constructed in the manner already explained using FIGS. 2, 3 and 4. A first clock signal 71 is tapped off from a first tapping point 52 and is supplied to the electronic circuit 6. A second clock signal 72 is tapped off from a second tapping point 53 and is supplied to the electronic circuit 6. As illustrated in FIG. 2, the clock signals 71 and 72 are periodic clock signals which are phase-shifted with respect to one another. In this respect, FIG. 2 shows a respective illustration of the temporal profile of the signal level V of the respective clock signal, which is plotted against time t. The clock signals 71 and 72 are thus periodic, square-wave, binary signals which are phase-shifted through 90° relative to one another.

The electronic circuit 6 is a logic gate, for example an AND gate or a NOR gate. The electronic circuit generates a pulsed output signal 73 by combining the two clock signals 71 and 72, the pulse width of said output signal being determined, on the one hand, by the type of logic combination (AND, NOR on the one hand; OR, NAND on the other hand) and by the distance between the tapping points 52 and 53. In this case, the phase angle of this pulsed signal is determined by the position of the tapping points 52 and 53 and by the type of combination.

When using this functional principle, very complex data and addressing signals can be generated. If a plurality of clock signals which are phase-shifted with respect to one another are tapped off from different tapping points of the clock generator 5 and are respectively combined in pairs, as shown in FIG. 2, a plurality of output signals, for example eight output signals, can be generated thereby, said output signals comprising pulses which do not overlap and being able to be used, for example, to drive a memory element. Even more complex output signals, as are used, for example, for addressing in more complex memory circuits, can be generated from this output signal by subsequently combining these output signals in a downstream logic circuit. Another possibility is to generate an individualized data signal, which comprises the identification information of an RFID transponder for example, by means of individualized logic combination of signals which are generated in a first logic stage and have pulses which do not overlap. This signal can then be directly used to drive a modulator.

The invention claimed is:

1. An electronic module having organic components comprising:
   a first electronic circuit; and
   a clock generator having n organic switching elements, wherein n is greater than or equal to 11 and is odd, each element having an input and an output and connected in series from a first to the nth element and constructed from organic components, the output of the nth organic switching element being connected as an input to the first organic switching element, the outputs of two or more of the organic switching elements having at least one further switching element therebetween such that the two or more switching elements are not directly connected to one another, the outputs of the two or more switching elements being connected as a respective input to the first electronic circuit for tapping off two or more clock signals at tapping points from the outputs of the two or more switching elements to the respective corresponding inputs of the electronic circuit, the at least one further switching element output not being connected as a clock signal to the first electronic circuit, with the result that a first clock signal for the first electronic circuit is tapped off from the output of a first of the two or more switching elements at a first tapping point and a second clock signal, which is phase-shifted with respect to the first clock signal, for the first electronic circuit is tapped off at a second tapping point from the output of a second of the two or more switching elements so that a clock signal is only applied to the first electronic circuit from the outputs of the two or more switching elements and not from the further switching element output, and wherein the outputs of three or more of the organic switching elements of the clock generator are connected to respective inputs of the first electronic circuit for the purpose of tapping off three or more clock signals which are phase-shifted with respect to one another, and in that the first electronic circuit has two or more logic gates which are constructed from organic components and combine the three or more clock signals to generate two or more output signals having pulses which do not overlap in time of occurrence.

2. The electronic module as claimed in claim 1, wherein the first electronic circuit is a logic circuit which is constructed from organic components.

3. The electronic module as claimed in claim 2, wherein the first electronic circuit comprises one or more logic gates constructed from organic components and logically combine two or more of said clock signals to generate one or more output signals for a second electronic circuit.

4. The electronic module as claimed in claim 3 including the second electronic circuit and wherein the second electronic circuit is a logic circuit constructed from organic components.

5. The electronic module as claimed in claim 1 wherein the two or more switching elements are at a distance from each other comprising at least one intervening switching element therebetween.

6. The electronic module as claimed in claim 1 wherein at least two of the clock signals are combined in the first electronic circuit using a NOR gate or an AND gate to generate an asymmetrical pulsed output signal, the pulse width of the pulses of the pulsed output signal being determined by the number of organic switching elements arranged between the tapping points of the clock signals.

7. The electronic module as claimed in claim 1 wherein the three or more clock signals which are phase-shifted with respect to one another are respectively combined in pairs using a logic gate, the number of organic switching elements arranged between the respective tapping points of the clock signals being selected in such a manner that the two or more output signals have pulses which do not overlap in time of occurrence.

8. The electronic component as claimed in claim 1 wherein the first electronic circuit is one of a two-stage or multistage logic circuit.

9. The electronic module as claimed in claim 1 wherein the one or more output signals from the first electronic circuit are supplied to a second electronic circuit as data signals.

10. The electronic module as claimed in claim 9 including the second electronic circuit and wherein the second electronic circuit has a memory unit and the one or more output signals from the first electronic circuit are supplied to the second electronic circuit as an addressing signal.

11. The electronic module as claimed in claim 1 wherein the electronic module includes components that form an RFID transponder which also has an antenna resonant circuit, a rectifier and a digital control circuit, the clock generator being connected to a clock input of the digital control circuit.

12. The electronic module as claimed in claim 1 wherein the first electronic circuit and clock generator are formed on a flexible film element and arranged to operate as a security element.

* * * * *

UNITED STATES PATENT AND TRADEMARK OFFICE
CERTIFICATE OF CORRECTION

| | | |
|---|---|---|
| PATENT NO. | : 7,843,342 B2 | Page 1 of 1 |
| APPLICATION NO. | : 11/817329 | |
| DATED | : November 30, 2010 | |
| INVENTOR(S) | : Andreas Ullmann et al. | |

It is certified that error appears in the above-identified patent and that said Letters Patent is hereby corrected as shown below:

Title page, item [73] Assignee: Change from "Polyic GmbH &Co. KG"

to

--PolyIC GmbH & Co. KG--

Signed and Sealed this
Fifth Day of April, 2011

David J. Kappos
*Director of the United States Patent and Trademark Office*